United States Patent [19]

Ohhinata

[11] 4,239,985
[45] Dec. 16, 1980

[54] TRIGGER CIRCUIT FOR A THYRISTOR
[75] Inventor: Ichiro Ohhinata, Yokohama, Japan
[73] Assignee: Hitachi, Ltd., Japan
[21] Appl. No.: 891,002
[22] Filed: Mar. 28, 1978
[30] Foreign Application Priority Data
  Mar. 3, 1977 [JP] Japan ................................. 52-34550
[51] Int. Cl.³ ........................................... H03K 17/72
[52] U.S. Cl. ................................ 307/252 G; 307/305
[58] Field of Search ........... 307/252 R, 252 C, 252 G, 307/305
[56] References Cited
U.S. PATENT DOCUMENTS
4,002,946  1/1977  Liang ............................... 307/252 G Primary Examiner—John Zazworsky
Attorney, Agent, or Firm—Craig & Antonelli

[57] ABSTRACT

A trigger circuit for a thyristor comprising at least one of each of an NPN transistor and a PNP transistor and a PNPN switch to trigger a 4-terminal thyristor by feeding a collector current of the PNP transistor into a cathode gate of the thyristor and by taking out a collector current of the NPN transistor from an anode gate of the thyristor. An emitter of the PNP transistor is connected to a power supply through a resistor, and a cathode and an anode of the PNPN switch is connected to a base of the PNP transistor and a base of the NPN transistor, respectively. By controlling the on-off operation of the PNPN switch, the thyristor is selectively triggered, so that the trigger circuit can be operated by a single low voltage supply and does not require any separate circuit for holding a conducting state of the thyristor.

9 Claims, 4 Drawing Figures

TRIGGER CIRCUIT FOR A THYRISTOR

BACKGROUND OF THE INVENTION

1. Field of the Invention

The present invention relates to a trigger circuit for a bilateral switch of a 4-terminal thyristor capable of passing a continuous A.C. signal for use in a telephone exchange system or the like.

2. Description of the Prior Art

A semiconductor switch circuit comprising a 4-terminal thyristor capable of switching A.C. signals with a small trigger voltage under any load conditions is disclosed in the U.S. Pat. No. 3,959,668, in which a pair of 4-terminal thyristors each having a cathode gate and an anode gate are connected in inverse-parallel thereby to constitute a bilateral switch, and a cathode gate trigger circuit including a positive voltage supply for feeding a current into the respective cathode gates is connected to each of the cathode gates of the respective 4-terminal thyristors constituting the bilateral switch, while an anode gate trigger circuit including a negative voltage supply for taking out a current from the respective anode gates is connected to each of the anode gates of the 4-terminal thyristors, whereby gate current is caused to flow continuously with a small trigger voltage irrespective of the amplitude of the signal voltage so that the A.C. signal current can be passed through the thyristors without any momentary interruption even when the A.C. signal current is reduced below a self-holding current value of the thyristors. However, because the semiconductor bilateral switch circuit is driven with the P-type gate and the N-type gate, it requires the positive and negative power supplies and two switching circuits. Therefore, the semiconductor bilateral switch circuit is uneconomical.

The present inventors have previously proposed a semiconductor switch circuit as shown and disclosed in the U.S. Pat. No. 4,058,741 in which a pair of 4-terminal thyristors are connected in inverse-parallel to constitute a bilateral switch, and a current-supplying type constant-current circuit including a power supply for supplying a current and a current-sinking type constant-current circuit including no power supply and sinking a current are connected to each cathode gate and each anode gate, respectively, of the thyristors and a switching circuit is connected between the constant-current circuits so that it responds a potential of the bilateral switch to automatically feed the trigger current of the current-supplying type constant-current circuit into the cathode gates of the bilateral switch and also into the current-sinking type constant-current circuit, whereby the switch circuit is controlled by a single power supply and a single switch. However, since this semiconductor switch circuit feeds the trigger current of the current-supplying type constant-current circuit into the cathode gate of the bilateral switch and also into the current-sinking type constant-current circuit, when the potential of the bilateral switch and the reference potential of the current-sinking type constant-current circuit are equal, the trigger current of the current-supplying type constant-current circuit flows through the both circuits so that a current of $I_K/2$ flows into each circuit, where $I_K$ is the constant current. Thus, in order to prevent the occurrence of a case where the current does not reach the firing current for the anode gate and the cathode gate of the bilateral switch, the constant current $I_K$ must be selected to more than twice as high as the cathode gate firing current. Furthermore, there is another drawback that in order to pass the A.C. signal through the semiconductor switch circuit by maintaining it in a closed position a circuit for holding the conducting state thereof must be separately provided.

SUMMARY OF THE INVENTION

It is an object of the present invention to provide a trigger circuit for a thyristor capable of controlling both an anode gate and a cathode gate of the thyristor with a single low voltage power supply and with a small trigger current, indpendently of an amplitude of a signal voltage.

It is another object of the present invention to provide a trigger circuit for a thyristor which requires no separate circuit for holding the conducting state of the thyristor.

In accordance with the present invention there is provided a trigger circuit for a thyristor comprising at least one of each of a PNP transistor and an NPN transistor to trigger an anode gate and a cathode gate of a 4-terminal thyristor by feeding a current into the cathode gate and taking out a current from the anode gate, and switching means connected between the bases of the respective transistors for holding the conducting state of the thyristor.

DESCRIPTION OF THE PREFERRED EMBODIMENTS

Figure 1:
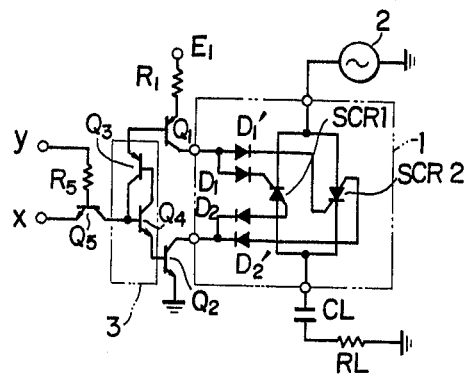
FIG. 1 shows a semiconductor switch circuit which is provided with an embodiment of the trigger circuit for a thyristor according to the present invention.

FIG. 1 shows a first embodiment of a trigger circuit for a thyristor according to the present invention, which is incorporated in a bilateral switch circuit comprising 4-terminal thyristors $SCR_1$ and $SCR_2$, diodes $D_1$, $D'_1$, $D_2$ and $D'_2$ for blocking a backward current. $Q_1$ and $Q_2$ denote a PNP transistor and an NPN transistor, respectively, for driving a bilateral switch 1, numeral 3 denotes a PNPN switch having a self-holding function and comprising a PNP transistor $Q_3$ and an NPN transistor $Q_4$, $Q_5$ denotes an NPN transistor for controlling the operation of the PNPN switch 3, $R_1$ and $R_5$ denote resistors, $E_1$ denotes a power supply for the trigger circuit, numeral 2 denotes an A.C. signal source, $C_L$ and $R_L$ denote a load capacitance and a load resistance, respectively, and x and y denote control input terminals.

The above circuit configuration may be used to pass a ringing signal with the bilateral switch 1 being used as a telephone speech path switch. When logical "1" signals are applied to both the control input terminals x and y, the transistor $Q_5$ is operated in an inverse transistor mode to drive the PNPN switch 3, which has a function of self-holding when a current above a predetermined level flows therethrough. Thus, even after the y input has been changed to "0" level to cut off the transistor $Q_5$, the PNPN switch 3 remains in the conducting state. Thus, the base currents of the PNP transistor $Q_1$ and the NPN transistor $Q_2$ continue to flow so as to allow the collector currents thereof to flow. The base currents of the PNP transsistor $Q_1$ and the NPN transistor $Q_2$ thus function as the self-holding current of the PNPN switch 3. If the potential of the bilateral switch 1 is positive at that time, the collector current of the NPN transistor $Q_2$ flows to drive the anode gate of the bilateral switch 1. If the potential of the bilateral switch 1 is negative the collector current of the PNP transistor $Q_1$ flows to drive the cathode gate of the bilateral switch 1. Accordingly, whatever the potential of the bilateral switch 1 may be, at least one of the gates of the bilateral switch is driven. This means that when there is a phase difference in the voltage and the current of the A.C. signal so that the current value is reduced below the holding current for the 4-terminal thyristors $SCR_1$ and $SCR_2$ requiring the supply of the gate current, the gate current can be readily supplied whatever high voltage level the potential of the bilateral switch may be.

When it is desired to stop driving the gate of the bilateral switch 1, a logical "1" input may be applied to the y input terminal and a logical "0" input may be applied to the x input terminal to cut off the PNPN switch 3. If the y input is maintained at "0" level after the PNPN switch 3 has been cut off, the PNPN switch 3 maintains the cut off state whether the x input assumes "1" level or "0" level. The transistors $Q_1$ and $Q_2$ and the PNPN switch 3 may be connected in other ways. For example, the resistor $R_1$ may be connected between the base of the transistor $Q_1$ and the emitter of the transistor $Q_3$. Alternatively, the resistor $R_1$ may be connected between the base of the transistor $Q_2$ and the emitter of the transistor $Q_4$. In this case, the potential of the PNPN switch 3 when it is turned on is higher so that the turn-on operation is facilitated.

Figure 2:
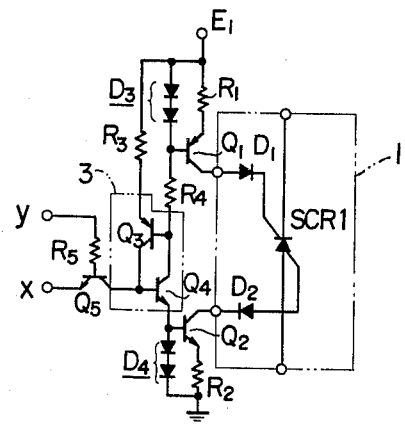
FIGS. 2 and 3 show semiconductor switch circuits which are provided with other embodiments of the trigger circuit for a thyristor according to the present invention.

FIG. 2 shows a second embodiment of the trigger circuit for the thyristor according to the present invention. Although only one 4-terminal thyristor is shown to simplify the drawing, a pair of 4-terminal thyristors are connected in parallel and multi-connected diodes are connected to the respective gates of the thyristors, like in the circuit shown in FIG. 1. In the circuit of FIG. 2, the base of the PNP transistor $Q_1$ is connected to the N-type base of the PNPN switch 3 through the resistor $R_4$. $D_3$ and $D_4$ denote diodes, $R_2$, $R_3$ and $R_4$ denote resistors, and other components are designated similarly to those in FIG. 1. In this circuit configuration, the self-holding current of the PNPN switch 3 is supplied through the resistor $R_3$ and the base current of the PNP transistor $Q_1$ is supplied to the N-type base of the PNPN switch 3 through the resistor $R_4$. With use of their constant voltage characteristics, the diodes $D_3$ and $D_4$ define the emitter currents of the PNP transistor $Q_1$ and the NPN transistor $Q_2$ so that a constant current is derived from each collector of the respective transistors $Q_1$ and $Q_2$ irrespective of the variation of the power supply $E_1$.

Figure 3:
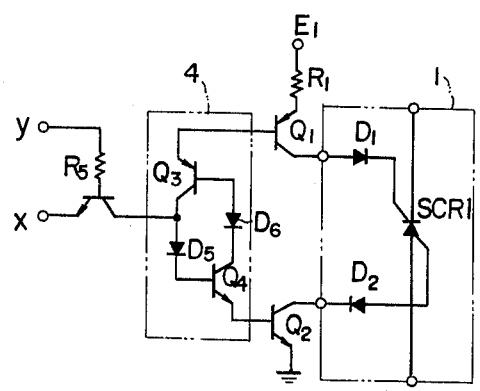
Figure 4:
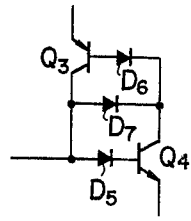
FIG. 4 shows another embodiment of the switching circuit according to the present invention.

FIG. 3 shows a third embodiment of the trigger circuit for the thyristor according to the present invention, in which numeral 4 denotes a switching circuit having the self-holding function comprising the PNP transistor $Q_3$, the NPN transistor $Q_4$ and level shifting diodes $D_5$ and $D_6$. By the use of the level shifting diodes $D_5$ and $D_6$, the turn-off operation is more facilitated than when the PNPN switch is singly used. The PNP transistor $Q_3$ and the NPN transistor $Q_4$ may be connected to the transistors $Q_1$ and $Q_2$, for driving the thyristor $SCR_1$ at the emitters thereof as shown in FIG. 3, or may be connected to the transistors $Q_1$ and $Q_2$ at the base and the emitter thereof, as shown in FIG. 2, respectively. In this case, level shifting elements such as diodes or resistors may be inserted. Furthermore, as shown in FIG. 4, the switching circuit having the self-holding function as shown in FIG. 3 may be added with a clamping diode $D_7$ to prevent the saturation of the transistors $Q_3$ and $Q_4$. While the positive power supply $E_1$ is used in the above embodiments, a negative power supply may be used with the power supply being connected to the emitter of the NPN transistor $Q_2$ and the emitter of the transistor $Q_1$ being grounded. While the input circuit for controlling the PNPN switch 3 is shown to be simply constructed by the resistor $R_5$ and the transistor $Q_5$, other circuit to turn on and off the PNPN switch and establish the holding state which does not affect the base current may be used. The PNPN switch 3 has an advantage of consuming no power at the off-state but has a disadvantage of erroneous firing due to rate effect. Thus, components and/or circuits for preventing the erroneous firing due to the rate effect may be connected to the PNPN switch 3. For example, a resistor may be connected between the P-type base and the N-type emitter, or a variable impedance erroneous firing prevention circuit as proposed by the present inventors and disclosed in the U.S. Pat. No. 4,015,143, may be connected. Furthermore, each of the PNP and NPN transistors for triggering the thyristors may be substituted by a modification circuit such as transistors connected in Darlington pair or the like.

I claim:

1. A trigger circuit for a thyristor comprising at least one of each of an NPN transistor and a PNP transistor for triggering a 4-terminal thyristor by feeding a collector current of said PNP transistor into a cathode gate thereof and taking out a collector current of said NPN transistor from an anode gate thereof, a power supply connected to an emitter of one of said NPN and PNP transistors, and switching means having a self-holding function and connected between bases of said NPN and PNP transistors, wherein said switching means comprises a PNPN switch, an anode of said PNPN switch being connected to the base of said PNP transistor ad a cathode of said PNPN switch being connected to the base of said NPN transistor.

2. A trigger circuit for a thyristor comprising at least one of each of an NPN transistor and a PNP transistor for triggering a 4-terminal thyristor by feeding a collector current of said PNP transistor into a cathode gate thereof and taking out a collector current of said NPN transistor from an anode gate thereof, a power supply connected to an emitter of one of said NPN and PNP transistors, and switching means having a self-holding function and connected between bases of said NPN and PNP transistors, wherein said switching means comprises a PNPN switch, the base of said PNP transistor being connected to an N-type base of said PNPN switch through a resistor, an anode of said PNPN switch being connected to the power supply through a resistor, and a cathode of said PNPN switch being connected to the base of said NPN transistor.

3. A trigger circuit for a thyristor according to claim 2, further comprising a plurality of diodes connected between the power supply and the base of said PNP transistor, and connected between the ground and the base of said NPN transistor.

4. A trigger circuit for a thyristor comprising at least one of each of an NPN transistor and a PNP transistor for triggering a 4-terminal thyristor by feeding a collector current of said PNP transistor into a cathode gate thereof and taking out a collector current of said NPN transistor from an anode gate thereof, a power supply connected to an emitter of one of said NPN and PNP transistors, and switching means having a self-holding function and connected between bases of said NPN and PNP transistors, wherein said switching means comprises a PNP transistor, an NPN transistor and a pair of level shifting diodes, a collector of said PNP transistor and a base of said NPN transistor being connected through one of said level shifting diodes, and a collector of said NPN transistor and a base of said PNP transistor being connected through the other level shifting diode.

5. A trigger circuit for a thyristor according to claim 4, wherein said switching means further comprises a diode connected between the collectors of said PNP and NPN transistors constituting said switching means.

6. A trigger circuit for a tyristor comprising at least one of each of an NPN transistor and a PNP transistor for triggering a 4-terminal thyristor by feeding a collector current of said PNP transistor into a cathode gate thereof and taking out a collector current of said NPN transistor from an anode gate thereof, a power supply connected to an emitter of one of said NPN and PNP transistors, and switching means having a self-holding function and connected between bases of said NPN and PNP transistors, wherein an on-off operation of the switching means selectively triggers the thyristor through the NPN and PNP transistors, and holds a conducting state of the thyristor, wherein the thyristor comprises a bilateral switch having first and second silicon controlled rectifiers coupled in parallel to one another between third and fourth terminals of the four terminal thyristor, each of said first and second silicon controlled rectifiers having a cathode gate coupled to the collector of said PNP transistor and an anode gate coupled to the collector of said NPN transistor, and with the cathode of the first silicon controlled rectifier and the anode of the second silicon controlled rectifier coupled to the third terminal and with the anode of the first silicon controlled rectifier and the cathode of the second silicon controlled rectifier coupled to the fourth terminal so that the first and second silicon controlled rectifiers conduct in opposite directions to one another.

7. A trigger circuit for a thyristor according to claim 6, further comprising an AC signal source coupled to said third terminal and a load circuit coupled to said fourth terminal, wherein said switching means controls the thyristor to control the flow of current between the AC signal source and the load circuit.

8. A trigger circuit for a thyristor according to claim 7, wherein the load circuit comprises a load capacitor, and a load resistor.

9. A trigger circuit for a thyristor comprising at least one of each of an NPN transistor and a PNP transistor for triggering a 4-terminal thyristor by feeding a collector current of said PNP transistor into a cathode gate thereof and taking out a collector current of said NPN transistor from an anode gate thereof, a power supply connected to an emitter of one of said NPN and PNP transistors, and switching means having a self-holding function and connected between bases of said NPN and PNP transistors, wherein an on-off operation of the switching means selectively triggers the thyristor through the NPN and PNP transistors, and holds a conducting state of the thyristor, further comprising first and second input terminals coupled to the switching means for controlling the operation of said switching means in accordance with first and second input signals applied, respectively, to said first and second input terminals.

* * * * *